US009954026B2

(12) United States Patent
Sakuragi

(10) Patent No.: US 9,954,026 B2
(45) Date of Patent: Apr. 24, 2018

(54) IMAGING APPARATUS AND IMAGING SYSTEM

(71) Applicant: CANON KABUSHIKI KAISHA, Tokyo (JP)

(72) Inventor: Takamasa Sakuragi, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/217,526

(22) Filed: Jul. 22, 2016

(65) Prior Publication Data
US 2017/0048475 A1 Feb. 16, 2017

(30) Foreign Application Priority Data
Aug. 13, 2015 (JP) ................................. 2015-159788

(51) Int. Cl.
H04N 3/14 (2006.01)
H04N 5/335 (2011.01)
H01L 27/146 (2006.01)
H04N 5/378 (2011.01)

(52) U.S. Cl.
CPC ....... *H01L 27/14643* (2013.01); *H04N 5/378* (2013.01)

(58) Field of Classification Search
CPC ...... H04N 5/376; H04N 5/3765; H04N 5/378; H01L 5/378
USPC ........ 348/294–324; 250/208.1; 257/290–292
See application file for complete search history.

(56) References Cited

U.S. PATENT DOCUMENTS

| 7,023,482 | B2 | 4/2006 | Sakuragi |
| 8,278,613 | B2 | 10/2012 | Okita |
| 8,638,384 | B2 | 1/2014 | Sakuragi |
| 8,884,864 | B2 | 11/2014 | Sakuragi |
| 2012/0043454 | A1 | 2/2012 | Sakuragi |
| 2015/0109504 | A1 | 4/2015 | Sakuragi |
| 2015/0109505 | A1 | 4/2015 | Sakuragi |
| 2015/0326812 | A1 | 11/2015 | Sakuragi |
| 2016/0014356 | A1 | 1/2016 | Sakuragi |
| 2016/0150176 | A1 | 5/2016 | Hiyama |
| 2016/0182902 | A1* | 6/2016 | Guo .................... H04N 5/341 348/301 |

OTHER PUBLICATIONS

U.S. Appl. No. 15/227,576, filed Aug. 3, 2016.
(Continued)

*Primary Examiner* — Yogesh Aggarwal
(74) *Attorney, Agent, or Firm* — Fitzpatrick, Cella, Harper & Scinto

(57) ABSTRACT

An imaging apparatus includes a pixel configured to generate a signal in accordance with an incident light by a photoelectric conversion; a differential amplifier including a first input terminal to which a voltage based on the signal from the pixel is input, and a second input terminal to which a reference voltage is input; a current supply unit configured to supply a bias current to the differential amplifier; and a comparing unit configured to compare the voltage of the first input terminal of the differential amplifier with a threshold voltage, and configured to output a control signal based on a comparison result to the current supply unit, and the current supply unit changes a magnitude of the bias current supplied to the differential amplifier in accordance with the control signal input from the comparing unit.

21 Claims, 10 Drawing Sheets

(56) References Cited

OTHER PUBLICATIONS

U.S. Appl. No. 15/258,805, filed Sep. 7, 2016.
G. Nicollini, et al., "High-Frequency Full Differential Filter Using Operational Amplifiers Without Common-Mode Feedback", IEEE Journal of Solid-State Circuits, vol. 24, No. 3, pp. 803-813, Jun. 1989.

* cited by examiner

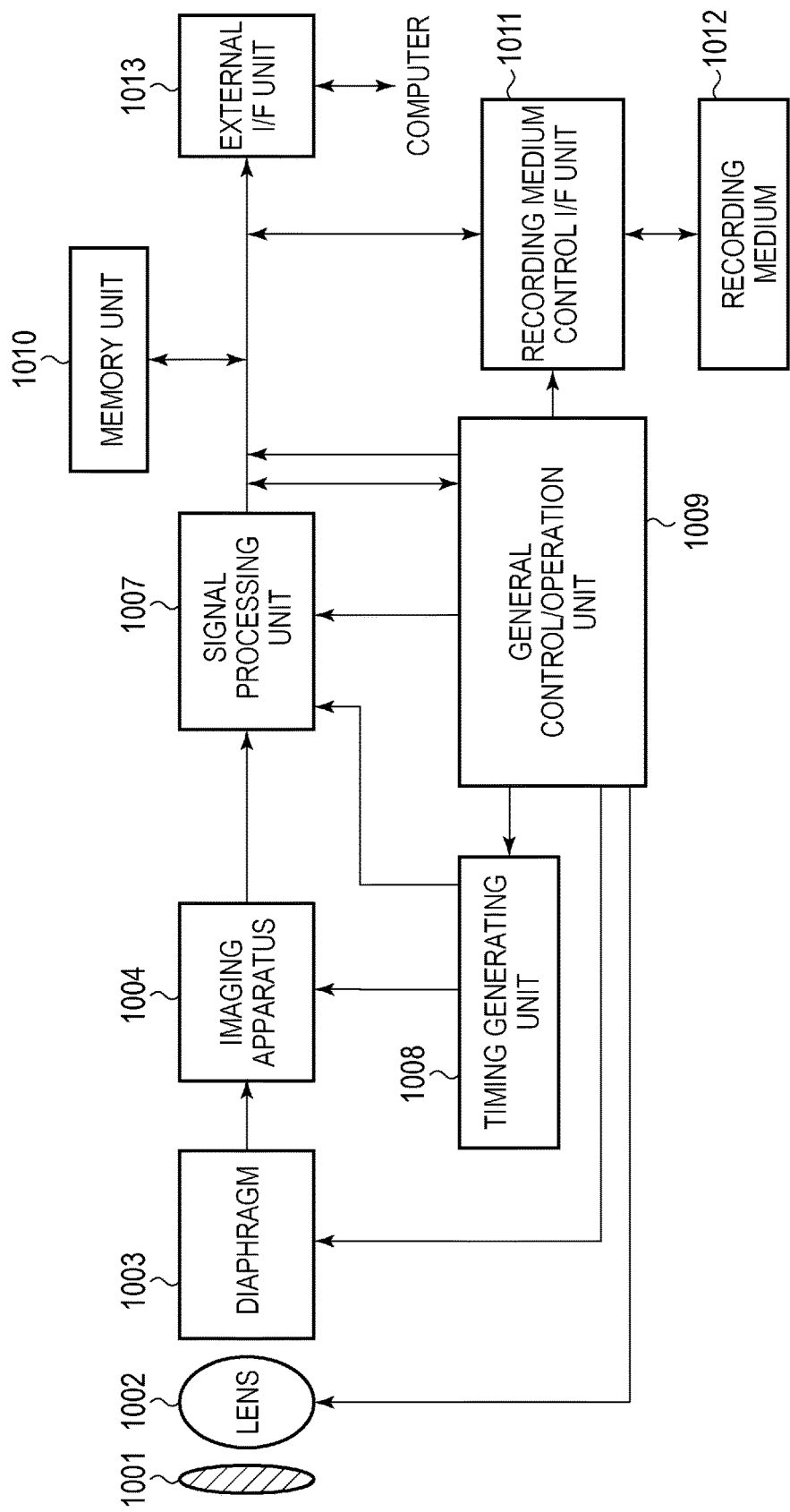

IMAGING APPARATUS AND IMAGING SYSTEM

BACKGROUND OF THE INVENTION

Field of the Invention

The present invention relates to an imaging apparatus and an imaging system.

Description of the Related Art

In imaging apparatus such as complementary metal oxide semiconductor (CMOS) image sensors, there is a demand for a faster imaging process. Therefore, a faster process is demanded also in an amplifier circuit used in an imaging apparatus. One technique for performing a faster amplification process in an amplifier circuit is to increase the output slew rate of an amplifier circuit.

G. Nicollini, F. Moretti, and M. Conti, "High-frequency fully differential filter using operational amplifiers without common-mode feedback", IEEE Journal of Solid-State Circuits, vol. 24, no. 3, pp. 803-813, June 1989 discloses a differential amplifier circuit in which a bias current of a second differential input stage is increased by the output of a first differential input stage resulting in an increased slew rate of the output of the second differential input stage.

In the differential amplifier circuit of the above document, however, a large bias current is always supplied thereto involving large power consumption. As discussed above, a larger slew rate of an amplifier circuit tends to cause increased power consumption. Therefore, in increasing the speed of an imaging apparatus, one of the objects will be to achieve lower power consumption along with an increased speed.

SUMMARY OF THE INVENTION

An imaging apparatus according to one aspect of the present invention includes a pixel configured to generate a signal in accordance with an incident light by a photoelectric conversion; a differential amplifier including a first input terminal to which a voltage based on the signal from the pixel is input, and a second input terminal to which a reference voltage is input; a current supply unit configured to supply a bias current to the differential amplifier; and a comparing unit configured to compare the voltage of the first input terminal of the differential amplifier with a threshold voltage, and configured to output a control signal based on a comparison result to the current supply unit, and the current supply unit changes a magnitude of the bias current supplied to the differential amplifier in accordance with the control signal input from the comparing unit.

An imaging apparatus according to another aspect of the present invention includes a plurality of pixels; a signal line to which the plurality of pixels are connected; a differential amplifier including a first input terminal electrically connected to the signal line, and a second input terminal to which a reference voltage is input; a first current source connected to the differential amplifier; a second current source connected to the differential amplifier via a switch; and a comparing unit including a first input terminal electrically connected to the first input terminal of the differential amplifier, a second input terminal to which a threshold voltage is input, and an output terminal connected to the switch.

An imaging system according to further another aspect of the present invention includes an imaging apparatus including a pixel configured to generate a signal in accordance with an incident light by a photoelectric conversion; a differential amplifier including a first input terminal to which a voltage based on the signal from the pixel is input, and a second input terminal to which a reference voltage is input; a current supply unit configured to supply a bias current to the differential amplifier; and a comparing unit configured to compare the voltage of the first input terminal of the differential amplifier with a threshold voltage, configured to output a control signal based on a comparison result to the current supply unit, and the current supply unit changes a magnitude of the bias current supplied to the differential amplifier in accordance with the control signal input from the comparing unit. The imaging system further includes a signal processing unit configured to process a signal output from the imaging apparatus.

Further features of the present invention will become apparent from the following description of exemplary embodiments with reference to the attached drawings.

BRIEF DESCRIPTION OF THE DRAWINGS

FIG. 13 is a block diagram illustrating a configuration of an imaging system according to a fourth embodiment.

DESCRIPTION OF THE EMBODIMENTS

Preferred embodiments of the present invention will now be described in detail in accordance with the accompanying drawings.

First Embodiment

Figure 1A:
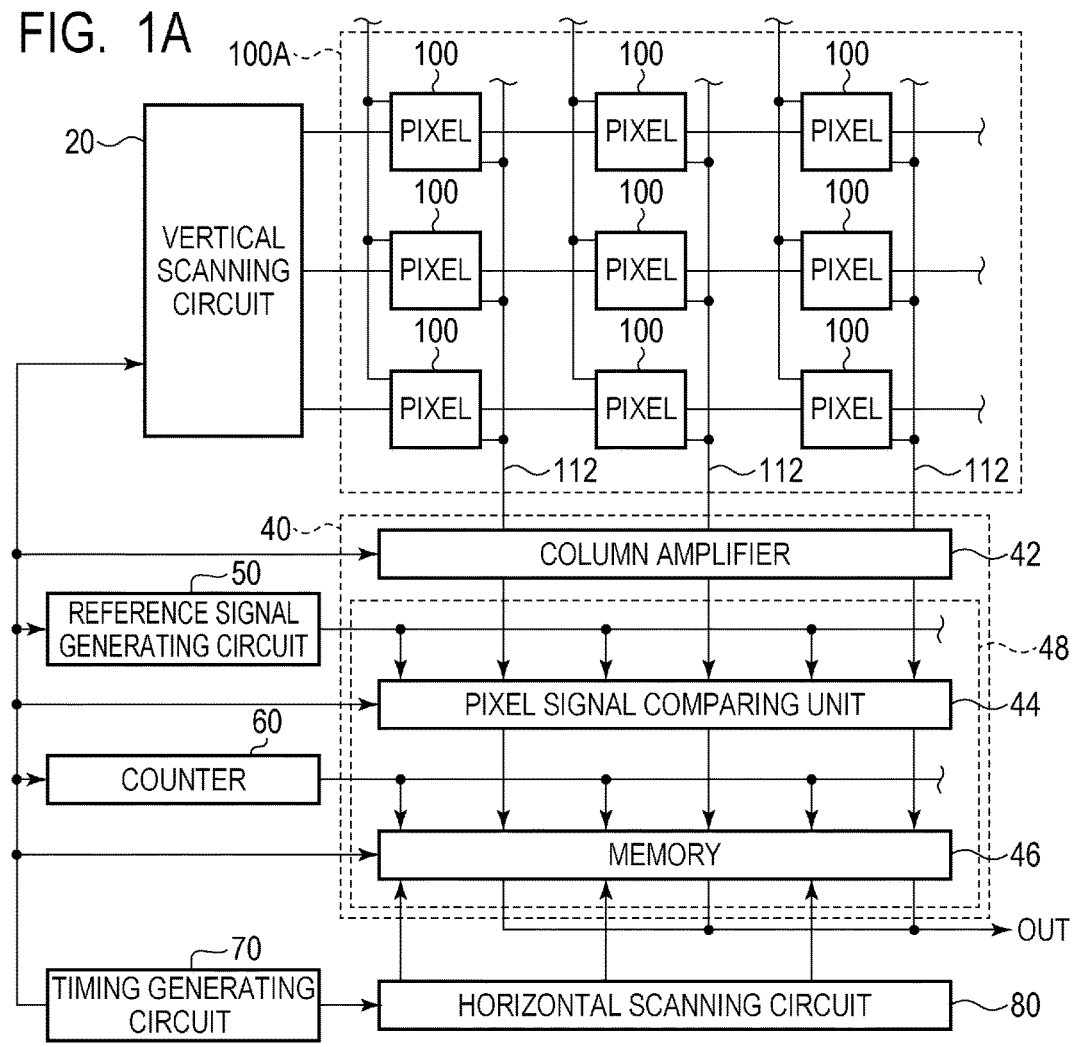
FIG. 1A is a block diagram illustrating a configuration of an imaging apparatus according to a first embodiment.

With reference to the drawings, the first embodiment of the present invention will be described. FIG. 1A is a block diagram illustrating a configuration of an imaging apparatus according to the first embodiment. The imaging apparatus has a pixel array 100A, a vertical scanning circuit 20, a signal processing circuit 40, a reference signal generating circuit 50, a counter 60, a timing generating circuit 70, and a horizontal scanning circuit 80.

The pixel array 100A includes a plurality of pixels 100 arranged in a matrix. The pixel 100 is a circuit that generates an analog signal in accordance with an incident light by a photoelectric conversion and outputs the analog signal. In FIG. 1A, three pixel rows by three pixel columns, that is, nine pixels 100 are extracted from the pixel array 100A and depicted. A plurality of pixels 100 included in a single pixel column are connected commonly to an associated output line 112 (signal line). The vertical scanning circuit 20 transmits a driving signal to the plurality of pixels 100 included in each pixel row on a row basis. Based on a driving signal from the vertical scanning circuit 20, the plurality of pixels 100 included in a selected pixel row output analog signals to the plurality of output lines 112 in parallel. The vertical scanning circuit 20 sequentially performs such control on each row and thereby a signal from each pixel 100 included in the pixel array 100A is output to the output line 112. Note that any arrangement of the pixels 100 in the pixel array 100A, such as any number of the plurality of pixels 100, any number of pixel rows, any number of pixel columns, or the like may be employed without limited to that depicted in FIG. 1A.

The signal processing circuit 40 includes a column amplifier 42 and an Analog-to-Digital conversion circuit (hereafter, referred to as AD conversion circuit) 48. The AD conversion circuit 48 includes a pixel signal comparing unit 44 and a memory 46. The signal processing circuit 40 processes, on a column basis, signals input from respective output lines 112 associated with respective pixel columns of the pixel array 100A. The signal processing circuit 40 performs, on a column basis, signal processing such as amplification, buffering, comparison, sampling-and-holding, AD conversion, and the like on signals input from output lines 112 on respective columns.

Note that a circuit element such as a buffer, a switch, an amplifier circuit, a clamp circuit, or the like may be arranged on each electric path between the output line 112 on each column and the signal processing circuit 40. Further, although the signal processing circuit 40 can include a circuit therein that performs a process on a pixel column basis of the pixel array 100A as described above, the signal processing circuit 40 may include a circuit that is not associated with each pixel column and may include a circuit to which signals are input commonly from a plurality of pixel columns.

The column amplifier 42 amplifies signals input from the output lines 112 and outputs them to the pixel signal comparing unit 44. The reference signal generating circuit 50 generates a reference signal and outputs it to the pixel signal comparing unit 44. The reference signal can be a ramp signal whose voltage increases or decreases with elapsed time, for example. The ramp signal may be a signal whose voltage varies stepwise with time. The pixel signal comparing unit 44 compares each signal from the column amplifier 42 with the reference signal and outputs signals which indicate comparison results to the memory 46. The counter 60 outputs a count value in accordance with time to the memory 46. At a timing when a comparison result indicated by an output signal of the pixel signal comparing unit 44 changes, a count value at this time is stored in the memory 46 as a digital signal corresponding to an output signal from the pixel 100. The memory 46 outputs a count value held therein to the outside of the imaging apparatus based on a driving signal from the horizontal scanning circuit 80.

The timing generating circuit 70 outputs a clock signal to the vertical scanning circuit 20, the column amplifier 42, the pixel signal comparing unit 44, the memory 46, the reference signal generating circuit 50, the counter 60, and the horizontal scanning circuit 80 and controls operation timings of respective sections.

Note that the signal processing circuit 40 illustrated in FIG. 1A includes an AD converter circuit 48 that converts signals from the pixels 100, which are analog signals, into digital signals. As a modified example, however, the signal processing circuit 40 may be configured to output signals from the pixels 100 to the outside of the imaging apparatus as analog signals without a conversion. In this case, the AD converter circuit 48 will be omitted.

Figure 1B:
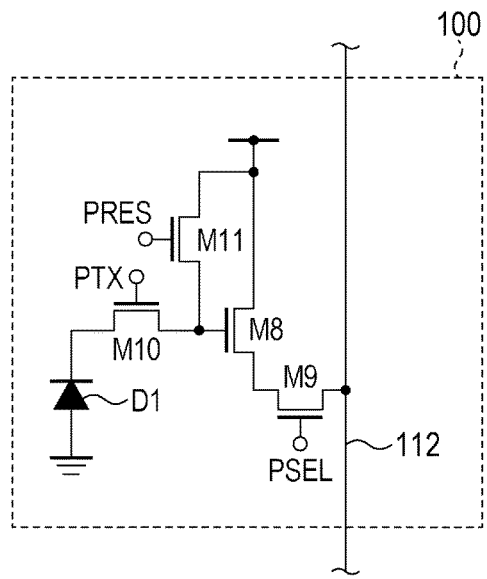
FIG. 1B is a circuit diagram illustrating a configuration of a pixel according to the first embodiment.

Next, a configuration of the pixel 100 will be described. FIG. 1B is a diagram illustrating an equivalent circuit of the pixel 100. While FIG. 1B depicts one pixel 100 only, the same configuration applies to other pixels 100.

The pixel 100 includes a photoelectric conversion unit D1 including a photodiode, an amplification transistor M8, a select transistor M9, a transfer transistor M10, and a reset transistor M11. The photoelectric conversion unit D1 generates and accumulates charges based on an incident light. The transfer transistor M10 is provided between the photoelectric conversion unit D1 and the gate of the amplification transistor M8. In response to turning on of the transfer transistor M10, charges accumulated in the photoelectric conversion unit D1 are transferred to the gate of the amplification transistor M8. The reset transistor M11 is provided between a power supply line that supplies a reset voltage and the gate of the amplification transistor M8. In response to turning on of the reset transistor M11, the gate voltage of the amplification transistor M8 is reset. The select transistor M9 controls connection between the amplification transistor M8 and the output line 112. The gate of the select transistor M9, the gate of the transfer transistor M10, and the gate of the reset transistor M11 are supplied respectively with a driving signal PSEL, a driving signal PTX, a driving signal PRES for controlling turning on and off of respective transistors.

The amplification transistor M8 of the pixel 100 is connected to a current source (not illustrated) via the output line 112. According to such a configuration, the amplification transistor M8 forms a source follower circuit. When the select transistor M9 is in an on-state, the amplification transistor M8 outputs, to the output line 112, a signal that is based on charges generated by the photoelectric conversion unit D1. In the present specification, a signal based on charges generated by the photoelectric conversion unit D1 is also referred to as a signal from the pixel 100.

Figure 2:
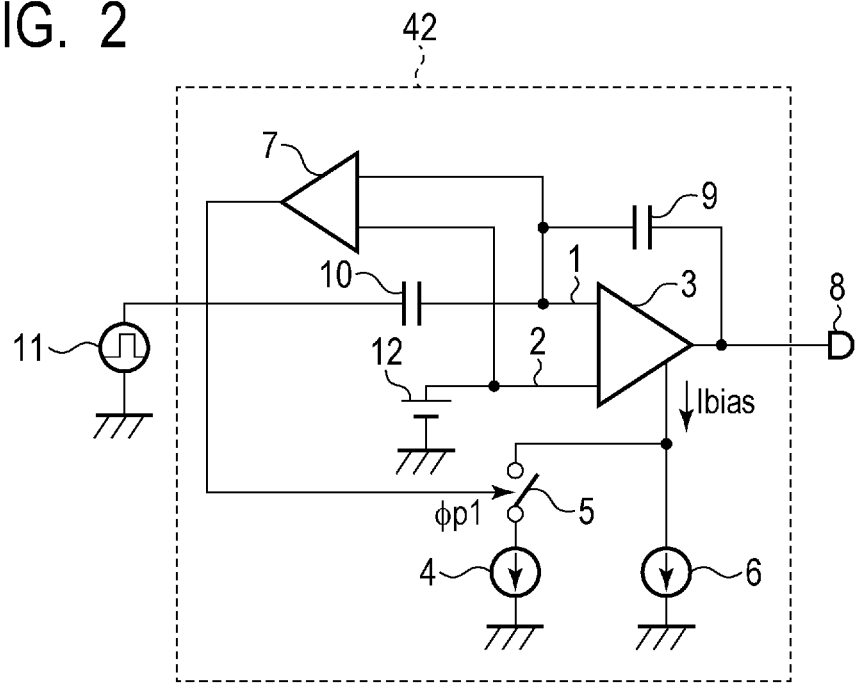
FIG. 2 is a circuit diagram illustrating a configuration of a column amplifier according to the first embodiment.
Figure 3:
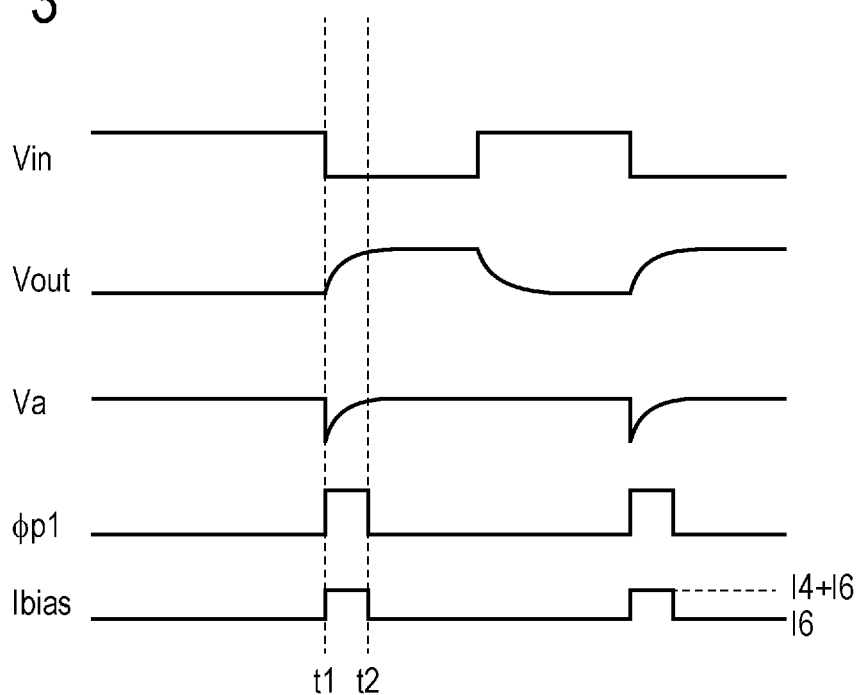
FIG. 3 is a diagram illustrating operation timings of the column amplifier according to the first embodiment.

In the following, an amplifier circuit and a driving method thereof that are applicable to the column amplifier 42 according to the first embodiment of the present invention will be described by using FIG. 2 and FIG. 3. FIG. 2 is a circuit diagram illustrating an example of the configuration of a differential amplifier circuit according to the present embodiment, and FIG. 3 is a timing diagram illustrating an example of operation timings of the circuit configuration of FIG. 2. Although an amplifier circuit described later is intended to be associated with the column amplifier 42 as an example, the amplifier circuit is applicable to anywhere as long as it is used for amplifying an analog signal from the pixel 100. Therefore, amplifier circuits disclosed in the first to third embodiments are not limited to the application to the column amplifier 42. Unless otherwise specified, the above description for the imaging apparatus can be applied to all the embodiments and their modified examples. Further, the configuration of the imaging apparatus described above is an example and thus may be properly altered. Further, a part of the configuration of any of the embodiments described below may be replaced with a part of another embodiment, or added to another embodiment.

In FIG. 2, the column amplifier 42 includes a differential amplifier 3, a boosting current source 4, a switch 5, a bias current source 6, a comparator 7, a feedback capacitor 9, an input capacitor 10, and a bias voltage source 12. A signal input to the column amplifier 42 from the pixel 100 is depicted equivalently as an input voltage source 11 in FIG. 2. Further, in the following description and later-described simulations, although the input voltage source 11 is assumed to be a square-wave voltage source for simplicity, the present embodiment is applicable in a similar manner to any signal waveform that may be output from the pixel 100.

The differential amplifier 3 has an inverting input terminal 1 that is a first input terminal and a non-inverting input terminal 2 that is a second input terminal. An output terminal of the differential amplifier 3 is connected to an output terminal 8 of the column amplifier 42. A voltage input to the column amplifier 42 from the input voltage source 11 is then input to the inverting input terminal 1 via the input capacitor 10. That is, the input voltage source 11 corresponding to a signal line on which output signals from a plurality of pixels 100 are transferred is electrically connected to the inverting input terminal 1 via the input capacitor 10. A bias voltage is input to the non-inverting input terminal 2 from the bias voltage source 12. In this case, the bias voltage is a voltage that serves as a reference voltage for an amplifying operation of the differential amplifier 3. The feedback capacitor 9 is connected between the output terminal and the inverting input terminal 1 of the differential amplifier 3. A voltage gain of the column amplifier 42 is determined by the capacitances of the feedback capacitor 9 and the input capacitor 10.

The boosting current source 4, the switch 5, and the bias current source 6 function as a current supply unit that supplies a bias current Ibias for driving the differential amplifier 3. The bias current source 6 is a first current source that supplies the bias current Ibias, and the boosting current source 4 is a second current source that supplies the bias current Ibias. The boosting current source 4 is connected to the differential amplifier 3 interposing the switch 5, and the bias current source 6 is connected directly to the differential amplifier 3. The switch 5 is controlled to be turned on or off by a control signal Φp1 output from the comparator 7. In a first state where the switch 5 is in an off-state, the bias current Ibias is supplied by the bias current source 6 only. In a second state where the switch 5 is in an on-state, the bias current Ibias is supplied by both of the boosting current source 4 and the bias current source 6.

Two input terminals of the comparator 7 are connected to the inverting input terminal 1 and the non-inverting input terminal 2 of the differential amplifier 3, respectively. That is, the comparator 7 compares the voltage of the inverting input terminal 1 with the voltage of the non-inverting input terminal 2 to output a signal indicating a comparison result. In other words, the comparator 7 has a function as a comparing unit that compares the voltage of the inverting input terminal 1 that is based on a signal from the pixel 100 with the voltage of the non-inverting input terminal 2 that is a predetermined threshold voltage. A signal indicating this comparison result is input to the switch 5 and used for control of turning on/off. In the present embodiment, when the voltage of the inverting input terminal 1 is lower than the voltage of the non-inverting input terminal 2, the output signal of the comparator 7 is high level and the switch 5 is in an on-state.

The differential amplifier 3 operates as an inverting amplifier circuit in the present embodiment. However, the present invention is not limited to the configuration of an inverting amplifier circuit and is applicable to a non-inverting amplifier circuit.

Next, with reference to FIG. 3, operation of the column amplifier 42 of the present embodiment will be described. A graph Vin in FIG. 3 represents a voltage input to the column amplifier 42 from the input voltage source 11. A graph Vout represents an output voltage of the column amplifier 42 from the output terminal 8. A graph Va represents a voltage of the inverting-input terminal 1. A graph Φp1 represents an output signal level of the comparator 7. A graph Ibias represents a bias current driving the differential amplifier 3.

In an initial state before time t1, the voltage Vin is high level. At this time, assuming that the input offset voltage of the differential amplifier 3 is zero, the voltage Va will be a voltage equal to the voltage of the bias voltage source 12 by a negative feedback effect. Therefore, the control signal Φp1 is low level and the switch 5 is in an off-state. Thus, the boosting current source 4 is not connected to the differential amplifier 3. The bias current Ibias therefore corresponds to a current I6 that is supplied by the bias current source 6.

At time t1, the voltage Vin transits from a high level to a low level. This transition represents a state where a pixel signal based on an incident light from the pixel 100 is output and a voltage variation occurs, for example. This brakes a virtual ground state of the differential amplifier 3, and the voltage Va decreases. In response, the voltage Vout starts increasing. In response to the decrease of the voltage Va of the inverting input terminal 1, the control signal Φp1 transits from a low level to a high level and the switch 5 is turned on. In response to the switch 5 being turned on, the boosting current source 4 is connected to the differential amplifier 3. At this time, a current I4 supplied by the boosting current source 4 is added to the current I6 supplied by the bias current source 6, and thus the bias current Ibias of the differential amplifier 3 becomes I4+I6. That is, the switch 5 is turned on and the boosting current source 4 is connected to the differential amplifier 3, which causes the bias current Ibias to increase from I6 to I4+I6.

At time t2, the voltage Va increases back to the original level, the differential amplifier 3 is again in a virtual ground state, the control signal Φp1 transits from a high level to a low level, and the switch 5 is turned off. This causes the bias current Ibias I6 of the differential amplifier 3 to decrease back to I6. In this way, the column amplifier 42 of the present embodiment can temporarily increase the bias current Ibias in a period from time t1 to time t2.

The output slew rate of the differential amplifier 3 depends on the bias current Ibias and a phase compensation capacitance Cf (not illustrated) inside the amplifier when the signal amplitude is larger. Specifically, there is a relationship that a larger bias current Ibias results in a larger output slew rate. Therefore, by controlling connection/disconnection of the boosting current source 4, the output slew rate of the differential amplifier 3 can be changed.

The column amplifier 42 of the present embodiment has the comparator 7 that compares the voltage of the inverting input terminal 1 with the voltage of the non-inverting input terminal 2 of the differential amplifier 3, and controls connection/disconnection of the boosting current source 4 based on the comparison result. This can increase the bias current Ibias when the amplitude of the voltage Vin input to the column amplifier 42 is large, which allows for an increased output slew rate of the differential amplifier 3. Therefore, the settling time of the differential amplifier 3 is reduced.

The use of such a differential amplifier circuit in the column amplifier 42 of the imaging apparatus allows for a fast operation of the imaging apparatus. Further, since the bias current Ibias is changed in accordance with the voltage Vin level, power consumption can be reduced compared to the case where the bias current Ibias is increased independently of the voltage Vin.

Second Embodiment

The second embodiment will be described by using FIG. 4, FIG. 5, and FIG. 6. The present embodiment has a modified configuration of the column amplifier 42 of the first embodiment. Since other sections of the configuration are similar to those of the first embodiment, description thereof will be omitted. Further, components having a function similar to those in the first embodiment are labeled with the same reference numerals, and description thereof will often be omitted or simplified.

Figure 4:
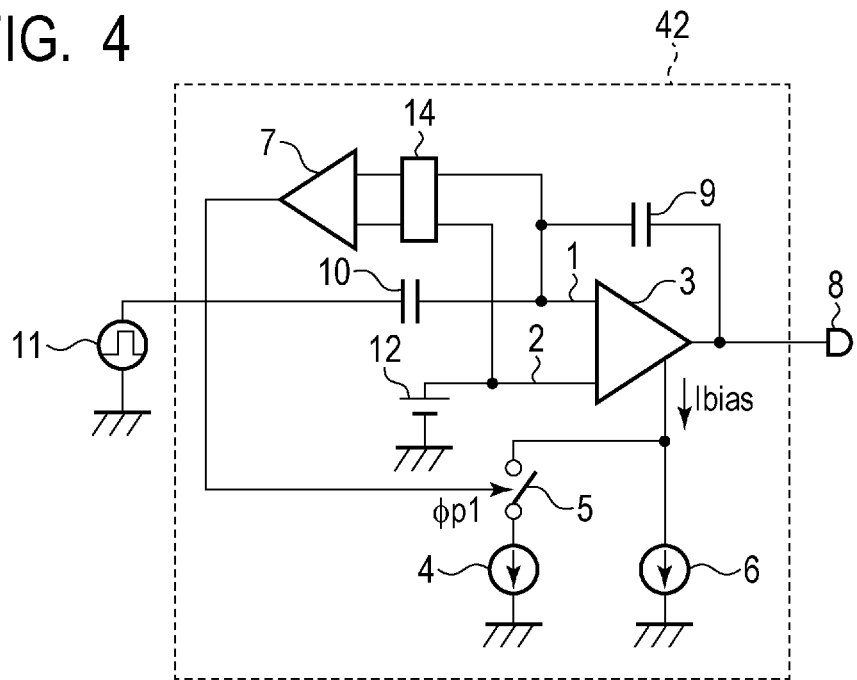
FIG. 4 is a circuit diagram illustrating a configuration of a column amplifier according to a second embodiment.

FIG. 4 is a circuit diagram illustrating a circuit configuration of the column amplifier 42 according to the present embodiment. The column amplifier 42 of the present embodiment further includes an offset voltage cancelling unit 14 in addition to respective circuit elements of the first embodiment. In the present embodiment, the comparator 7 and the offset voltage cancelling unit 14 function as a comparing unit.

The offset voltage cancelling unit 14 in FIG. 4 has a function of cancelling a difference between the offset voltage of the differential input terminals of the differential amplifier 3 and the offset voltage of the comparator 7. This can reduce a deviation of a change timing of the bias current Ibias that may occur due to the offset voltages of the differential amplifier 3 and the comparator 7.

Figure 5:
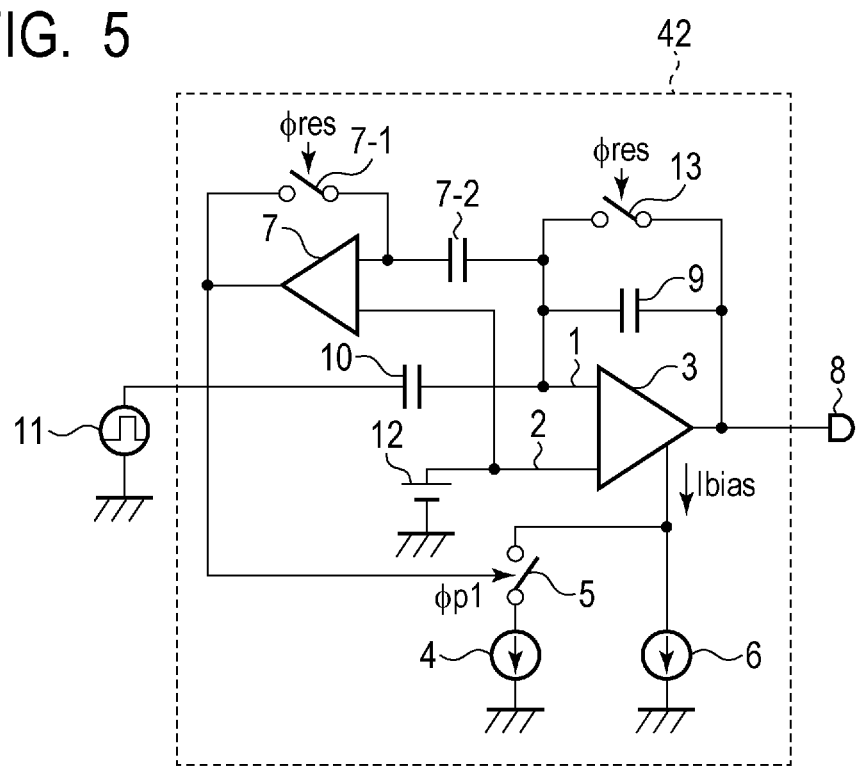
FIG. 5 is a circuit diagram illustrating a more specific configuration of the column amplifier according to the second embodiment.

FIG. 5 is a diagram illustrating an example of a specific configuration of the offset voltage cancelling unit 14 of FIG. 4. The offset voltage cancelling unit 14 of FIG. 4 corresponds to a switch 7-1, a switch 13, and a clamp capacitor 7-2 of FIG. 5. Both of the switch 7-1 and the switch 13 are controlled by a control signal Φres. The switch 7-1 and the switch 13 are in an on-state when the control signal Φres is high level, and the switch 7-1 and the switch 13 are in an off-state when the control signal Φres is low level. The switch 7-1 is provided between the first input terminal and the output terminal of the comparator 7. The clamp capacitor 7-2 is provided between the first input terminal of the comparator 7 and the inverting input terminal 1 of the differential amplifier 3. The switch 13 is provided between the inverting input terminal 1 of the differential amplifier 3 and the output terminal of the differential amplifier 3.

Figure 6:
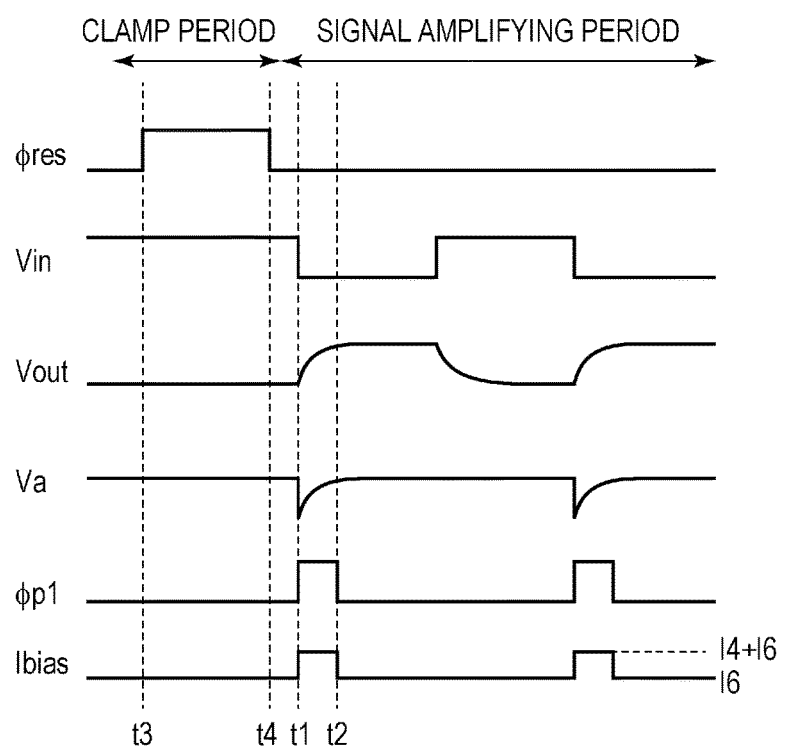
FIG. 6 is a diagram illustrating operation timings of the column amplifier according to the second embodiment.

FIG. 6 is a timing diagram illustrating an example of operation timings of the circuit configuration of FIG. 5. The timing diagram of FIG. 6 illustrates operation of the control signal Φres in addition to various voltage illustrated in FIG. 3. The operation timing in FIG. 6 can be roughly divided into two periods: a clamp period including time t3 and time t4 and a signal amplifying period including time t1 and time t2. The clamp period is a period for clamping a difference between the offset voltages of the differential amplifier 3 and the comparator 7 in the clamp capacitor 7-2 in order to reduce an effect of the offset voltages. Since operations during the signal amplifying period are similar to those of FIG. 3, description thereof will be omitted.

In an initial state before time t3, the control signal Φres is low level, and the switches 7-1 and 13 are both in an off-state. Then, when a clamp period starts and time t3 arrives, the control signal Φres transits from a low level to a high level and both of the switches 7-1 and 13 are turned on. At this time, a voltage corresponding to a difference between the offset voltage of the differential amplifier 3 and the offset voltage of the comparator 7 is applied to the clamp capacitor 7-2. At time t4, the control signal Φres transits from a high level to a low level and both of the switches 7-1 and 13 are turned off. This allows the offset voltage difference described above to be held in the clamp capacitor 7-2. Operations in a subsequent signal amplifying period are similar to those in the timing diagram of FIG. 3.

During a signal amplifying period, a voltage held in the clamp capacitor 7-2 functions to cancel a difference between the offset voltage of the differential amplifier 3 and the offset voltage of the comparator 7. Thus, a deviation of a timing of an increase in the output slew rate due to the difference between the offset voltages is reduced compared to the configuration of the first embodiment, and a settling time is further reduced. Therefore, according to the present embodiment, an advantage of a faster operation of the imaging apparatus is obtained in addition to the advantages of the first embodiment.

Third Embodiment

The third embodiment will be described by using FIG. 7 to FIG. 10. The present embodiment has a modified configuration of the column amplifier 42 of the second embodiment. Other sections of the configuration are similar to those of the second embodiment, description thereof will be omitted. Further, components having a similar function as those in the second embodiment are labeled with the same reference numerals, and description thereof will often be omitted or simplified.

Figure 7:
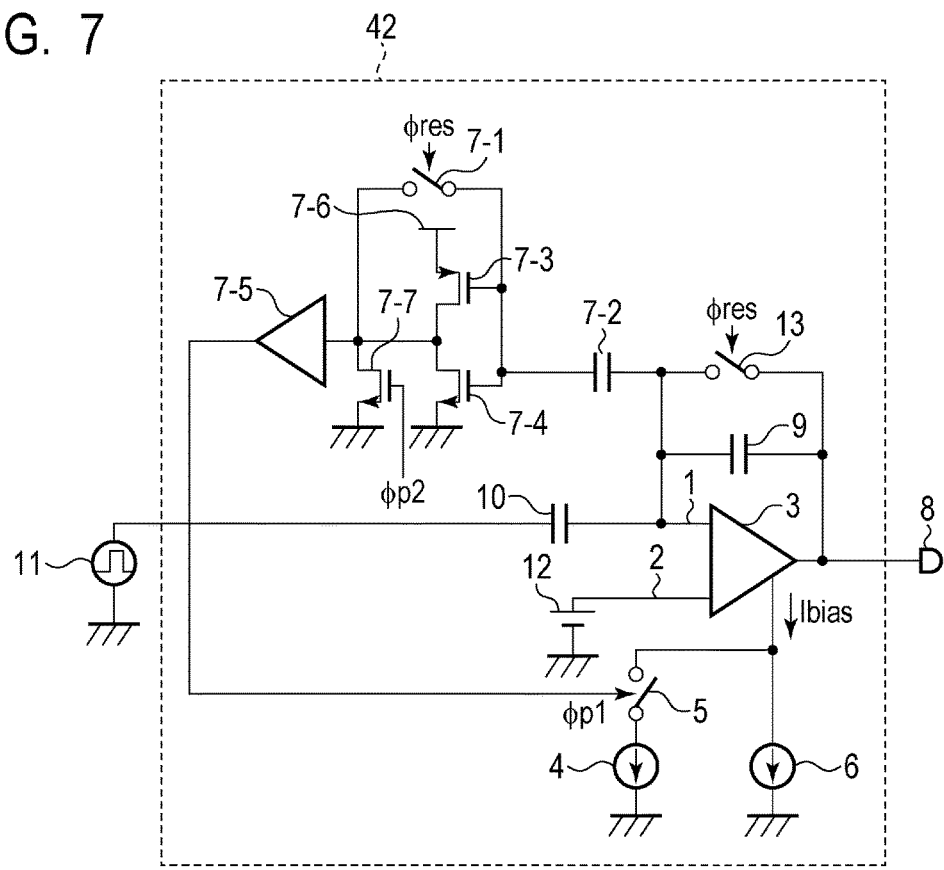
FIG. 7 is a circuit diagram illustrating a configuration of a column amplifier according to a third embodiment.

FIG. 7 is a circuit diagram illustrating an example of the configuration of a differential amplifier circuit according to the third embodiment. FIG. 7 is different from FIG. 5 in that the comparing unit is formed of a circuit employing a PMOS transistor 7-3, NMOS transistors 7-4 and 7-7, and a buffer 7-5.

The PMOS transistor 7-3 and the NMOS transistor 7-4 form a CMOS inverter. That is, a voltage of the inverting input terminal 1 of the differential amplifier 3 is input via the clamp capacitor 7-2 to the gates of the PMOS transistor 7-3 and the NMOS transistor 7-4 that form an input terminal of the CMOS inverter. The drain of the PMOS transistor 7-3 and the drain of the NMOS transistor 7-4 are connected to each other to form an output terminal of the CMOS inverter. The source of the PMOS transistor 7-3 is connected to a power supply line 7-6 and the source of the NMOS transistor 7-4 is connected to the ground (alternatively, a negative power supply). The switch 7-1 is connected between the input and output terminals of the CMOS inverter. The CMOS inverter arranged as described above is a logic inverting circuit that outputs a low-level voltage when the input voltage exceeds a predetermined logical threshold and outputs a high-level voltage when the input voltage is below the predetermined logical threshold.

The output terminal of the CMOS inverter is connected to the drain of the NMOS transistor 7-7 and the input terminal of the buffer 7-5. The gate of the NMOS transistor 7-7 is input with a control signal Φp2. The source of the NMOS transistor 7-7 is connected to the ground (alternatively, a negative power supply). That is, the NMOS transistor 7-4 and the NMOS transistor 7-7 are in a relationship of being connected in parallel. The output of the buffer 7-5 is input to the switch 5 as the control signal Φp1.

The NMOS transistor 7-7 has a function of a threshold voltage shift unit. That is, by controlling turning on or off of the NMOS transistor 7-7 connected in parallel to the NMOS transistor 7-4 within the CMOS inverter, an input threshold voltage of the CMOS inverter can be shifted. This operation will be described with reference to a timing diagram of FIG. 8.

Figure 8:
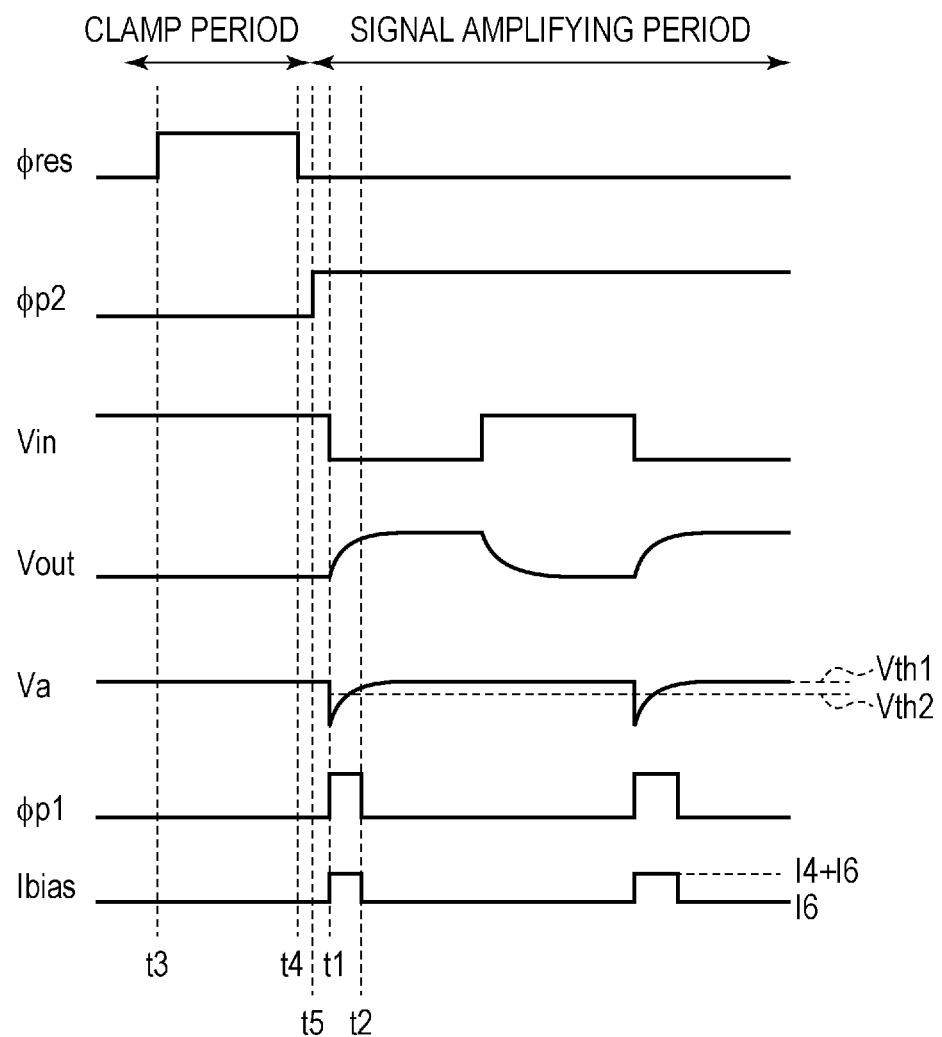
FIG. 8 is a diagram illustrating operation timings of the column amplifier according to the third embodiment.

FIG. 8 is a timing diagram illustrating an example of operation timings of the circuit configuration of FIG. 7. Description of operations similar to those of FIG. 6 will be omitted or simplified. At time t3, the control signal Φres transits from a low level to a high level, and both of the switches 7-1 and 13 are turned on. At this time, a voltage that is based on the offset voltage of the differential amplifier 3, based on the voltage of the non-inverting input terminal 2 of the differential amplifier 3, and based on a logic threshold voltage Vth1 of the CMOS inverter is applied to and held in the clamp capacitor 7-2.

The comparing unit of the present embodiment is input with a voltage of the inverting input terminal 1 of the differential amplifier 3 via the clamp capacitor 7-2 in which a voltage is held as described above. Thereby, the held voltage and the voltage of the inverting input terminal 1 of the differential amplifier 3 are compared.

At subsequent time t5, the control signal Φp2 becomes a high level and the NMOS transistor 7-7 is turned on. This causes the logic threshold voltage of the CMOS inverter to decrease from Vth1 to Vth2.

At time t1, in response to the voltage Vin transiting from a high level to a low level, the voltage Va of the inverting input terminal 1 decreases. In response to this decreased voltage exceeding a decrease amount of the threshold voltage of the CMOS inverter (Vth1−Vth2), the output of the CMOS inverter is inverted and the control signal Φp1 that is the output of the buffer 7-5 becomes a high level. Thereby, the switch 5 is turned on. In this way, the operation similar to the second embodiment is allowed also in the circuit configuration of the present embodiment illustrated in FIG. 7, and the threshold voltage can be adjusted to any value. For example, by setting the decrease amount of the threshold voltage of the CMOS inverter (Vth1−Vth2) to a value larger than an amplitude of noise, it is possible to suppress chattering in which the switch 5 would otherwise repeat turning on and off due to noise.

Further, the present embodiment enables the differential amplifier 3 to increase the bias current Ibias, only when the signal amplitude is larger. In this case, the bias current Ibias is smaller when the signal amplitude is smaller. This may facilitate a design of a phase compensation circuit. Further, a narrower small-signal bandwidth of the differential amplifier 3 may allow for achieving both a design with low noise and a fast operation. Therefore, when an amplifier circuit designed to have these additional advantages is mounted to the imaging apparatus, improvement in flexibility of design and a reduction of noise can be achieved.

Figure 9:
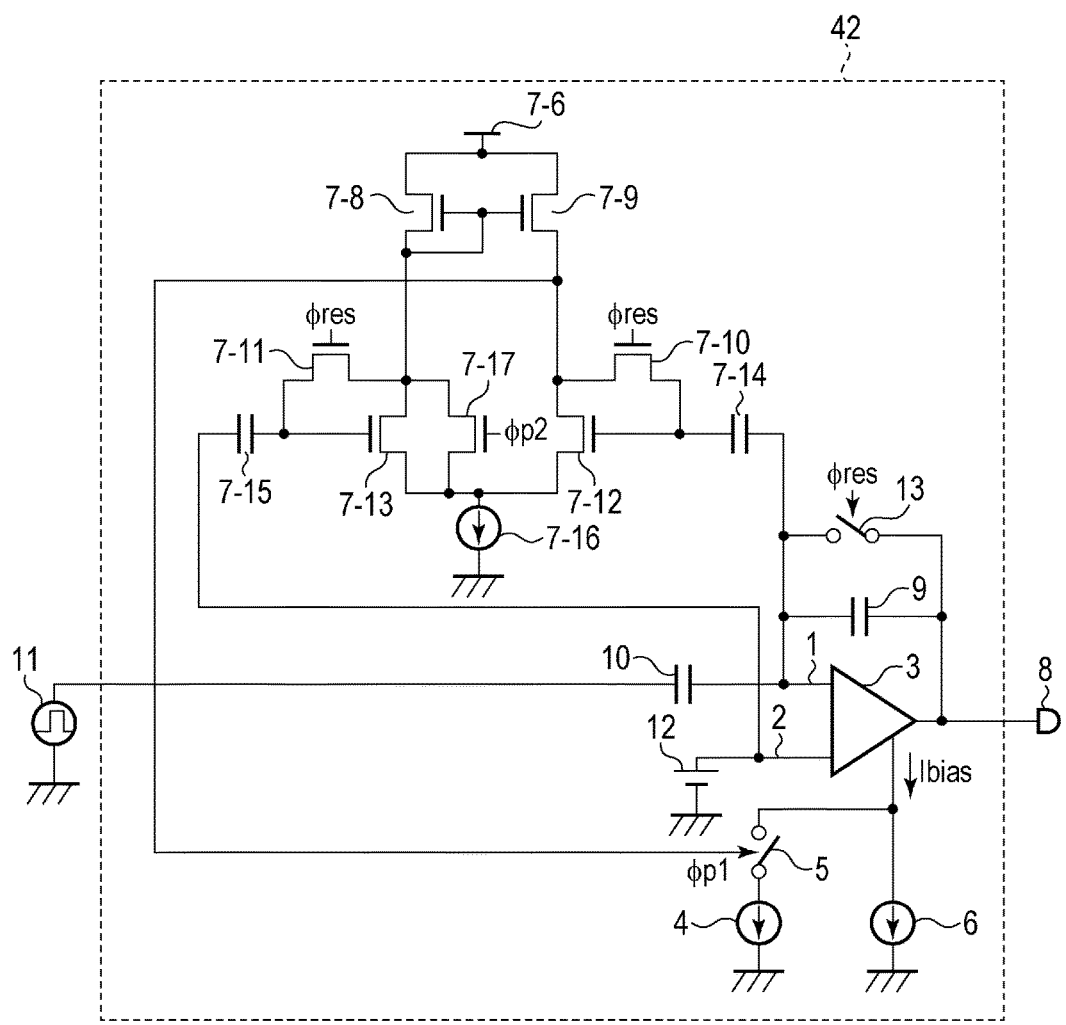
FIG. 9 is a circuit diagram illustrating another configuration of the column amplifier according to the third embodiment.

FIG. 9 is a circuit diagram illustrating another example of the configuration of a differential amplifier circuit according to the present embodiment. The circuit of FIG. 9 is different from that of FIG. 7 in that a circuit forming a comparing unit for comparing voltages between the input terminals of the differential amplifier 3 is a differential circuit. This differential circuit includes PMOS transistors 7-8 and 7-9, NMOS transistors 7-10, 7-11, 7-12, 7-13, and 7-17, clamp capacitors 7-14 and 7-15, and a current source 7-I6. The gates of the NMOS transistors 7-10 and 7-11 are input with a control signal Φres and thereby these transistors are controlled to be turned on or off. The gate of the NMOS transistor 7-17 is input with the control signal Φp2 and thereby this transistor is controlled to be turned on or off.

The inverting input terminal 1 of the differential amplifier 3 is connected to the gate of the NMOS transistor 7-12 via the clamp capacitor 7-14. The non-inverting input terminal 2 of the differential amplifier 3 is connected to the gate of the NMOS transistors 7-13 via the clamp capacitor 7-15. The current source 7-16 is connected to the sources of the NMOS transistors 7-12 and 7-13. Thereby, the NMOS transistors 7-12 and 7-13 form a differential pair.

The gates of the PMOS transistors 7-8 and 7-9 are commonly connected to each other, and this commonly connected node is also connected to the drain of the PMOS transistor 7-8 and the drain of the NMOS transistor 7-13. The drain of the PMOS transistor 7-9 is connected to the drain of the NMOS transistor 7-12, and this connection node is an output terminal of the differential circuit that outputs the control signal Φp1 to the switch 5. The sources of the PMOS transistors 7-8 and 7-9 are connected to the power supply line 7-6. Thereby, the PMOS transistors 7-8 and 7-9 function as an active load in the differential circuit.

The NMOS transistor 7-10 is provided so as to be able to short-circuit the gate and the drain of the NMOS transistor 7-12. The NMOS transistor 7-11 is provided so as to be able to short-circuit the gate and the drain of the NMOS transistor 7-13. The drain and the source of the NMOS transistor 7-17 are connected to the drain and the source of the NMOS transistor 7-13, respectively. The NMOS transistor 7-17 functions as a threshold voltage shift unit corresponding to the NMOS transistor 7-7 of FIG. 7.

Operation timings of the circuit of FIG. 9 are similar to those in FIG. 8. At time t3, in response to the control signal Φres transiting from a low level to a high level, both of the NMOS transistors 7-10 and 7-11 are turned on. Thereby, a voltage to cancel a voltage difference between the offset voltage of the differential amplifier 3 and the offset voltage of the differential circuit is held in the clamp capacitors 7-14 and 7-15 during a clamp period. Then, at time t5, the control signal Φp2 becomes a high level from a low level, and the NMOS transistor 7-17 is turned on. This causes the offset voltage of the comparator to shift. More specifically, the voltage of the inverting input terminal 1 of the differential amplifier 3 at the time when the level of the control signal Φp1 is inverted is much lower than in the case where the NMOS transistor 7-17 is in an off-state. In this way, the operation similar to the second embodiment is allowed also in the circuit configuration of the present embodiment illustrated in FIG. 9, and the threshold voltage can be adjusted to any value.

Figure 10:
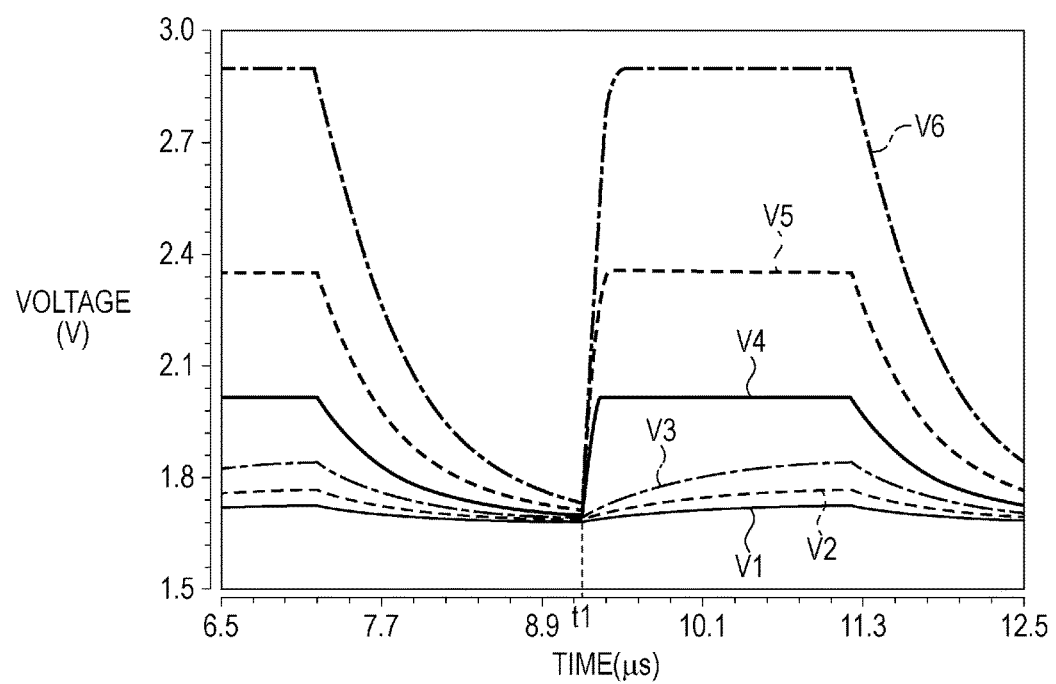
FIG. 10 illustrates a simulation result of output voltages according to the third embodiment.

FIG. 10, FIG. 11A, FIG. 11B, FIG. 11C, and FIG. 12 are graphs indicating simulation results of operations of the circuit of FIG. 7 or FIG. 9 according to the present embodiment. FIG. 10 is a graph illustrating a voltage waveform at the output terminal 8. Voltage waveforms labeled with V1 to V6 are output voltage waveforms when the amplitude of the input voltage is changed with six steps. A larger index number of V1 to V6 (i.e., 1 to 6) represents a larger amplitude of the input voltage. The voltage waveforms V1, V2, and V3 each represent a simulation for a case of a smaller input voltage amplitude where the voltage amplitude of the inverting input terminal 1 of the differential amplifier 3 is within a range not exceeding a threshold voltage. The voltage waveforms V4, V5, and V6 each represent a simulation for a case of a larger input voltage amplitude where the voltage amplitude of the inverting input terminal 1 of the differential amplifier 3 exceeds the threshold voltage. In the cases of the voltage waveforms V4, V5, and V6, the switch 5 is turned on and the boosting current source 4 temporarily supplies a bias current to the differential amplifier 3.

In the cases of the voltage waveforms V1, V2, and V3, in response to a change in the input voltage from the input voltage source 11 at time t1, the output voltage starts a gradual increase. That is, in the voltage waveforms V1, V2, and V3, the output slew rate is smaller and the settling time is longer. In contrast, in the cases of the voltage waveforms V4, V5, and V6, the output voltage increases in a short period of time after time t1 and then becomes a constant value. That is, in the voltage waveforms V4, V5, and V6, the output slew rate increases due to a bias current supplied by the boosting current source 4 and thus the settling time is reduced.

Figure 11A:
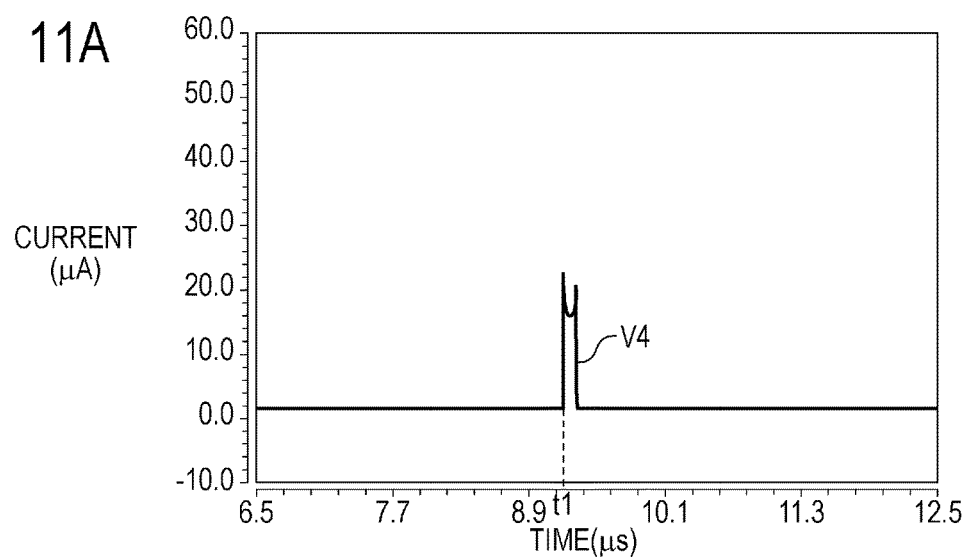
FIG. 11A, FIG. 11B, and FIG. 11C illustrate simulation results of bias currents according to the third embodiment.
Figure 11B:
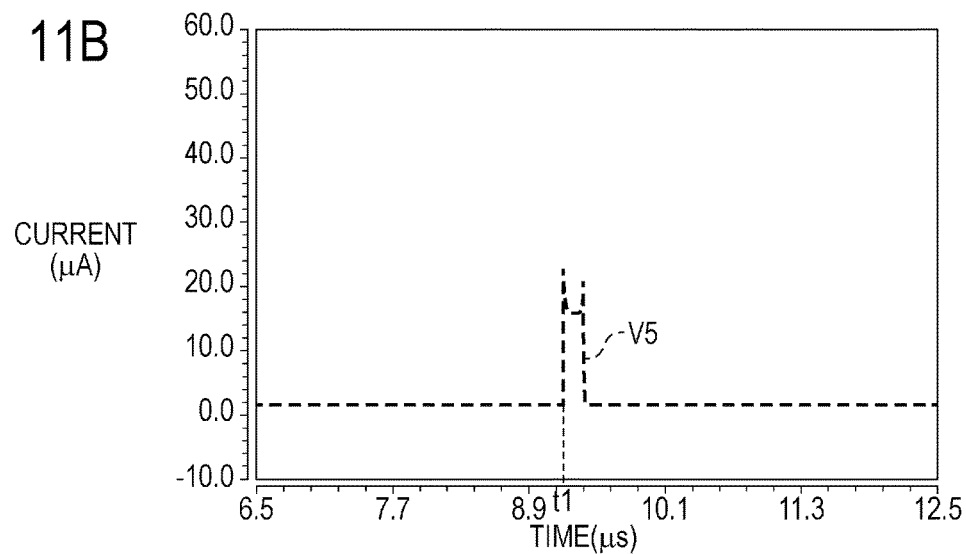
Figure 11C:
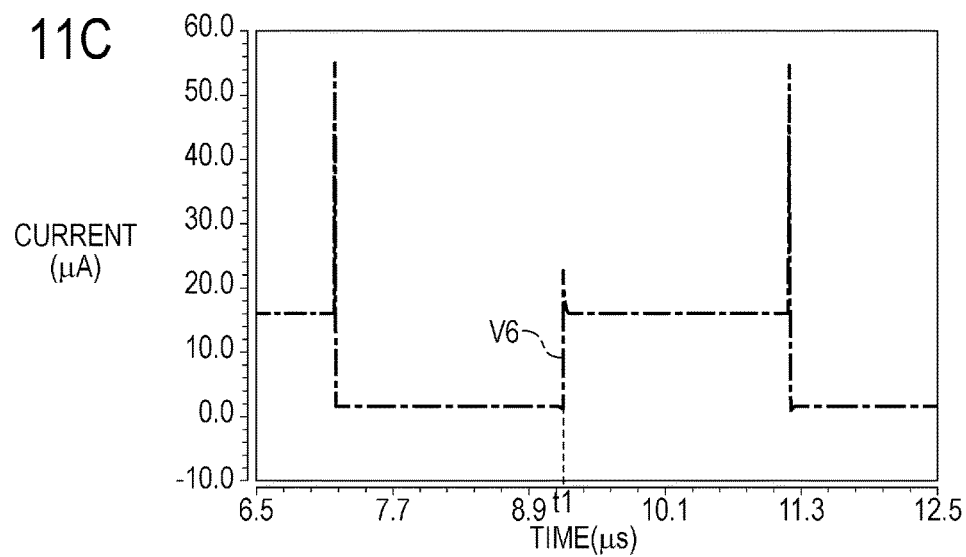

FIG. 11A, FIG. 11B, and FIG. 11C are graphs each illustrating a change in the bias current supplied to the differential amplifier 3 in the cases of the voltage waveforms V4, V5, and V6 of FIG. 10, respectively. At time t1, in any case of the voltage waveforms V4, V5, and V6, the boosting current source 4 is connected to the differential amplifier 3 and the bias current increases. Then, after a certain period of time has elapsed and the voltage of the inverting input terminal 1 of the differential amplifier 3 becomes stable, the bias current supplied to the differential amplifier 3 returns to the original value. It can be understood from FIG. 11A, FIG. 11B, and FIG. 11C that a larger amplitude of the input voltage results in a longer boosting time for increasing the bias current.

Figure 12:
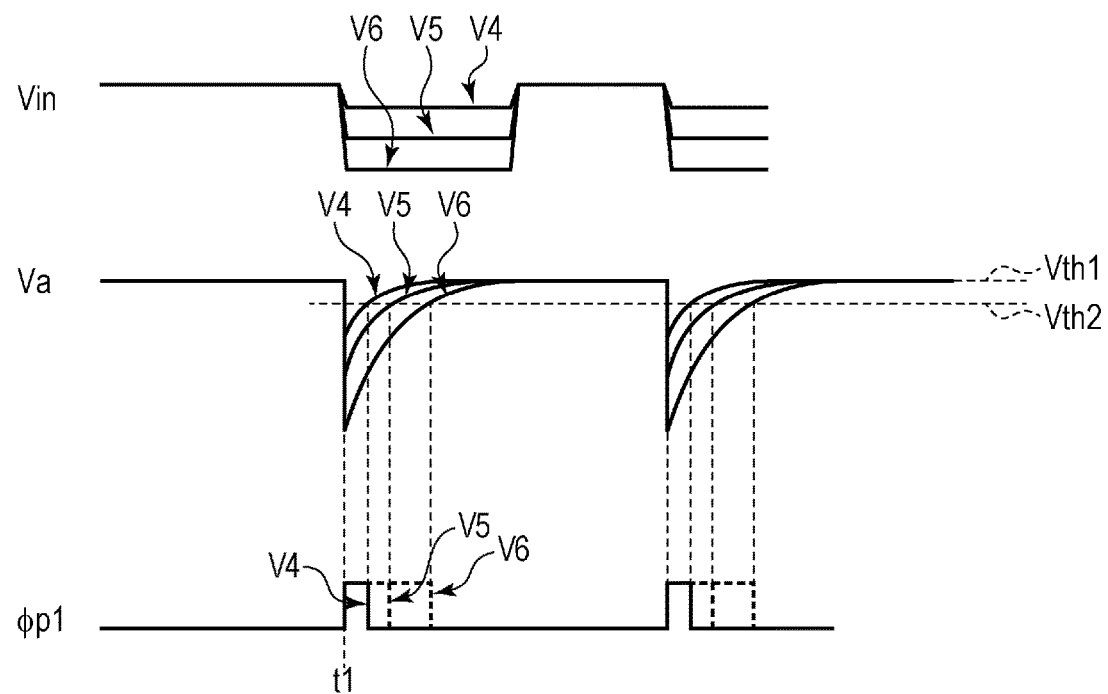
FIG. 12 is a diagram comparing the simulation results with the operation timings according to the third embodiment.

The relationship between the amplitude of the input voltage and the boosting time will be described with reference to FIG. 12 that compares simulation results and operation timings. A larger change in the voltage Vin results in a larger change amount of the voltage Va of the inverting input terminal 1 of the differential amplifier 3. Therefore, a larger amplitude of the voltage Vin results in a longer period of time of a graph being below the threshold voltage Vth2. Therefore, since the pulse width of the control signal Φp1 is determined in accordance with the level of the voltage Vin, the boosting time is adjusted in accordance with the level of the voltage Vin and thus an increase of power consumption is suppressed to the minimum. This allows for achieving both fast operation and low power consumption of the imaging apparatus.

Fourth Embodiment

An imaging system according to the fourth embodiment will be described. An example of an imaging system may be a digital still camera, a digital camcorder, a copying machine, a facsimile, a mobile phone, an on-vehicle camera, an observation satellite, and the like. FIG. 13 illustrates a block diagram of a digital still camera as an example of an imaging system according to the fourth embodiment.

In FIG. 13, the imaging system includes a barrier 1001 for protection of a lens, a lens 1002 that captures an optical image of a subject on an imaging apparatus 1004, and a diaphragm 1003 for changing the amount of a light passing through the lens 1002. The imaging system further includes an imaging apparatus 1004 described in any of the above first to third embodiments, and the imaging apparatus 1004 outputs, as image data, an optical image that is captured by the lens 1002.

The imaging system further includes a signal processing unit 1007, a timing generating unit 1008, a general control/operation unit 1009, a memory unit 1010, a recording medium control interface (I/F) unit 1011, a recording medium 1012, and an external I/F unit 1013. The signal processing unit 1007 performs various signal processes such as correction, data compression, or the like on image data output by the imaging apparatus 1004. The timing generating unit 1008 outputs various timing signals to the imaging apparatus 1004 and the signal processing unit 1007. The general control/operation unit 1009 controls the entire imaging system. The memory unit 1010 functions as a frame memory for temporarily storing image data. The recording medium control I/F unit 1011 performs recording or reading to a recording medium. The recording medium 1012 is formed of a removable semiconductor memory, a semiconductor memory embedded in the imaging system, or the like and performs recording or reading of image data. The external I/F unit 1013 is an interface for communicating with an external computer or the like.

In this example, a signal for control such as the timing signal may be input from the outside of the imaging system, and the imaging system preferably has at least the imaging apparatus 1004 and the signal processing unit 1007 that processes imaging signals output from the imaging apparatus 1004.

The imaging system according to the present embodiment includes an imaging apparatus according to the first to third embodiments as the imaging apparatus 1004. The imaging apparatus according to the first to third embodiments can achieve both an increase in speed and a reduction in power consumption. Therefore, the imaging system according to the present embodiment can achieve both faster capturing and lower power consumption.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-159788, filed Aug. 13, 2015, which is hereby incorporated by reference herein in its entirety.

What is claimed is:

1. An imaging apparatus comprising:
a pixel configured to generate a signal in accordance with an incident light by a photoelectric conversion;
a differential amplifier including a first input terminal to which a voltage based on the signal from the pixel is input, and a second input terminal to which a reference voltage is input;
a current supply unit configured to supply a bias current to the differential amplifier; and
a comparing unit configured to compare the voltage of the first input terminal of the differential amplifier with a threshold voltage, and configured to output a control signal based on a comparison result to the current supply unit,
wherein the current supply unit changes a magnitude of the bias current supplied to the differential amplifier in accordance with the control signal input from the comparing unit, and
wherein, when the control signal indicates that the voltage based on the signal from the pixel has changed, the current supply unit increases the bias current supplied to the differential amplifier.

2. The imaging apparatus according to claim 1,
wherein the current supply unit includes a first current source, a second current source, and a switch, and
wherein the current supply unit switches the switch in accordance with the control signal to switch a first state where only the first current source supplies the bias current to/from a second state where both of the first current source and the second current source supply the bias current.

3. The imaging apparatus according to claim 1, wherein the threshold voltage corresponds to a voltage of the second input terminal of the differential amplifier.

4. The imaging apparatus according to claim 1, wherein the comparing unit further includes a comparator, and
an offset voltage cancelling unit configured to cancel a difference between an input offset voltage of the comparator and an input offset voltage of the differential amplifier.

5. The imaging apparatus according to claim 4,
wherein the offset voltage cancelling unit includes a clamp capacitor, and
wherein the offset voltage cancelling unit cancels the difference between the input offset voltages by causing the clamp capacitor to hold a voltage corresponding to the difference between the input offset voltage of the comparator and the input offset voltage of the differential amplifier.

6. The imaging apparatus according to claim 4, wherein the comparing unit further includes a threshold voltage shift unit configured to shift the threshold voltage.

7. The imaging apparatus according to claim 6, wherein the threshold voltage shift unit shifts the threshold voltage after the difference between the input offset voltages has been cancelled.

8. The imaging apparatus according to claim 1,
wherein the comparing unit includes an inverter and a clamp capacitor,
wherein the clamp capacitor holds, as the threshold voltage, a voltage that is based on a voltage of the second input terminal of the differential amplifier, based on a logic threshold of the inverter, and based on an input offset voltage of the differential amplifier, and
wherein a voltage of the first input terminal of the differential amplifier is input to the inverter via the clamp capacitor to perform the comparison.

9. The imaging apparatus according to claim 8, wherein the comparing unit further includes a threshold voltage shift unit that shifts the logic threshold of the inverter.

10. The imaging apparatus according to claim 9, wherein the threshold voltage shift unit shifts the threshold voltage after the clamp capacitor has held the voltage.

11. An imaging system comprising:
the imaging apparatus according to claim 1; and
a signal processing unit configured to process a signal output from the imaging apparatus.

12. An imaging apparatus comprising:
a plurality of pixels;
a signal line to which the plurality of pixels are connected;
a differential amplifier including a first input terminal electrically connected to the signal line, and a second input terminal to which a reference voltage is input;
a first current source connected to the differential amplifier;
a second current source connected to the differential amplifier via a switch; and
a comparing unit including a first input terminal electrically connected to the first input terminal of the differential amplifier, a second input terminal to which a threshold voltage is input, and an output terminal connected to the switch.

13. The imaging apparatus according to claim 12, wherein, when a control signal output from the comparing unit indicates that a voltage based on a signal from the pixel has changed, the switch is controlled in accordance with the control signal to switch a first state where only the first current source supplies the bias current to/from a second state where both of the first current source and the second current source supply the bias current.

14. The imaging apparatus according to claim 12, wherein the threshold voltage corresponds to a voltage of the second input terminal of the differential amplifier.

15. The imaging apparatus according to claim 12, wherein the comparing unit further includes
a comparator, and
an offset voltage cancelling unit configured to cancel a difference between an input offset voltage of the comparator and an input offset voltage of the differential amplifier.

16. The imaging apparatus according to claim 15,
wherein the offset voltage cancelling unit includes a clamp capacitor, and
wherein the offset voltage cancelling unit cancels the difference between the input offset voltages by causing the clamp capacitor to hold a voltage corresponding to the difference between the input offset voltage of the comparator and the input offset voltage of the differential amplifier.

17. The imaging apparatus according to claim 15, wherein the comparing unit further includes a threshold voltage shift unit configured to shift the threshold voltage.

18. The imaging apparatus according to claim 17, wherein the threshold voltage shift unit shifts the threshold voltage after the difference between the input offset voltages has been cancelled.

19. The imaging apparatus according to claim 12,
wherein the comparing unit includes an inverter and a clamp capacitor, wherein the clamp capacitor holds, as the threshold voltage, a voltage that is based on a voltage of the second input terminal of the differential amplifier, based on a logic threshold of the inverter, and based on an input offset voltage of the differential amplifier, and wherein a voltage of the first input terminal of the differential amplifier is input to the inverter via the clamp capacitor to perform the comparison.

20. The imaging apparatus according to claim 19, wherein the comparing unit further includes a threshold voltage shift unit that shifts the logic threshold of the inverter.

21. The imaging apparatus according to claim 20, wherein the threshold voltage shift unit shifts the threshold voltage after the clamp capacitor has held the voltage.

* * * * *